(12) United States Patent
Lester et al.

(10) Patent No.: US 8,039,869 B2
(45) Date of Patent: Oct. 18, 2011

(54) GALLIUM NITRIDE DEVICE SUBSTRATE CONTAINING A LATTICE PARAMETER ALTERING ELEMENT

(75) Inventors: Steven D. Lester, Palo Alto, CA (US); Virginia M. Robbins, Los Gatos, CA (US); Scott W. Corzine, Sunnyvale, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 114 days.

(21) Appl. No.: 11/838,467

(22) Filed: Aug. 14, 2007

(65) Prior Publication Data
US 2007/0278622 A1    Dec. 6, 2007

Related U.S. Application Data

(62) Division of application No. 11/194,237, filed on Aug. 1, 2005, now Pat. No. 7,273,798.

(51) Int. Cl.
*H01L 33/04* (2010.01)
*H01L 29/15* (2006.01)

(52) U.S. Cl. ..... 257/190; 257/18; 257/28; 257/E29.193; 257/E31.035

(58) Field of Classification Search ............... None
See application file for complete search history.

(56) References Cited

U.S. PATENT DOCUMENTS

| 6,133,058 A | 10/2000 | Kidoguchi et al. | |
|---|---|---|---|
| 6,744,064 B2 * | 6/2004 | Lee et al. | 257/13 |
| 2002/0068201 A1 | 6/2002 | Vaudo | |
| 2004/0209402 A1 | 10/2004 | Chai et al. | |
| 2005/0161772 A1 | 7/2005 | Suzuki | |
| 2006/0233211 A1 * | 10/2006 | Edmond et al. | 372/43.01 |

FOREIGN PATENT DOCUMENTS

| EP | 1385215 | 1/2004 |
|---|---|---|
| WO | WO-00/68473 | 11/2000 |
| WO | WO-2005/004212 | 1/2005 |

OTHER PUBLICATIONS

Morita, Daisuke "High Output Power 365nm Ultraviolet Light Emitting Diode of GaN-Free Structure", *The Japan Society of Applied Physics*; XP-001162409, (Dec. 15, 2002).

* cited by examiner

*Primary Examiner* — Zandra Smith
*Assistant Examiner* — Pamela E Perkins
(74) *Attorney, Agent, or Firm* — Haynes and Boone, LLP

(57) ABSTRACT

A gallium nitride device substrate comprises a layer of gallium nitride containing an additional lattice parameter altering element located over a substitute substrate.

7 Claims, 4 Drawing Sheets

GALLIUM NITRIDE DEVICE SUBSTRATE CONTAINING A LATTICE PARAMETER ALTERING ELEMENT

This is a Divisional of application Ser. No. 11/194,237, filed on Aug. 1, 2005 now U.S. Pat. No. 7,273,798, the entire disclosure of which is incorporated herein by reference.

BACKGROUND

Sapphire and silicon carbon are used as substrates for many different electronic and optical devices formed using the gallium nitride (GaN) material system. The gallium nitride material system refers to alloys of indium (In), gallium (Ga), aluminum (Al), and boron (B) with nitrogen to form a nitride. Typically, the devices are fabricated by forming layers using various compositions of indium, gallium, aluminum, boron and nitrogen to create various alloy compositions. These alloys are typically grown, or deposited, as epitaxial layers over a substrate. These epitaxial layers are typically formed using growth techniques such as metal organic chemical vapor deposition (MOCVD), also referred to as organo-metallic vapor phase epitaxy (OMVPE) or other techniques. Typical materials formed using the gallium nitride material system include indium gallium nitride (InGaN), aluminum gallium nitride (AlGaN), aluminum indium gallium nitride (AlInGaN) and others. Typical devices formed using the gallium nitride material system include, for example, transistors and light emitting devices that emit light from about the ultraviolet (UV) portion of the electromagnetic spectrum to the blue and green visible portion of the electromagnetic spectrum. Light emitting diodes that emit light in the blue and green portion of the visible spectrum and laser devices that emit blue light have active regions comprising gallium nitride and indium gallium nitride.

To make an optoelectronic device, many material layers are grown upon one another over a substrate until the device is completed. Depending on the particular composition, each material layer has what is referred to as a "critical thickness." The critical thickness is dependent on the substrate used, the composition of the material forming the layer and the growth conditions under which the layer is grown. One way of defining the critical thickness is the thickness at which an epitaxially grown material layer begins to develop dislocations. Dislocations are defects in the crystal lattice of the material. Dislocations form when a lattice parameter mismatch exists between adjacent material layers. The dislocations degrade the optical quality of the material. When forming these layers epitaxially, it is often desirable to grow the layers as thick as possible while preserving the crystal structure so that low-defect material having high optical quality is obtained. By growing the material layers well below their critical thickness, the lattice mismatch between the adjacent layers is compensated by elastic strain. However, this may limit the usefulness of a device.

Further, using indium gallium nitride (InGaN) grown on gallium nitride (GaN) as an example, increasing the indium content to extend the wavelength of an optical device increases the lattice mismatch between the gallium nitride and the indium gallium nitride, thus limiting the thickness of the indium gallium nitride material layer. Both the thickness and indium concentration in indium gallium nitride alloys are limited because of the lattice mismatch with the underlying gallium nitride. Unfortunately, no currently available substrate material is lattice matched to indium gallium nitride.

SUMMARY OF THE INVENTION

A gallium nitride device substrate comprises a layer of gallium nitride containing an additional lattice parameter altering element located over a substitute substrate.

A method of forming a gallium nitride device substrate comprises providing a first sacrificial substrate, forming a layer of gallium nitride over the first sacrificial substrate, forming a first layer of gallium nitride containing an additional lattice parameter altering element over the layer of gallium nitride, attaching a substitute substrate to the layer of gallium nitride containing an additional lattice parameter altering element and removing the sacrificial substrate and the layer of gallium nitride.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

Although the embodiments in accordance with the invention of the gallium nitride device substrate containing a lattice parameter altering element will be described in the context of forming a substrate of indium gallium nitride, other substrates can be formed. For example, an aluminum gallium nitride substrate can be formed.

Figure 1A:
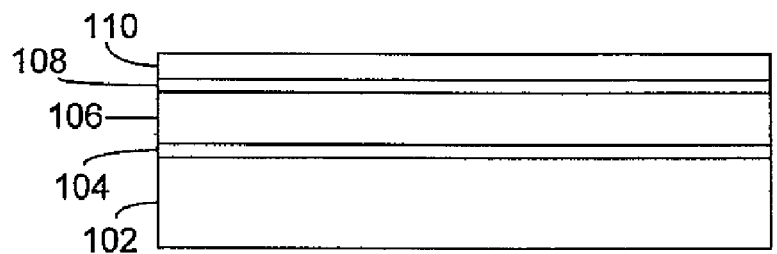
FIGS. 1A through 1C are schematic diagrams collectively illustrating a gallium nitride device substrate containing a lattice parameter altering element in accordance with an embodiment of the invention.
Figure 1B:
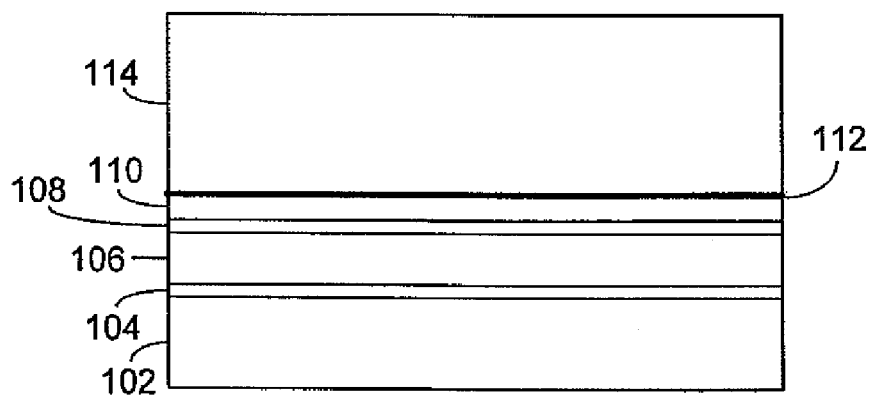
Figure 1C:
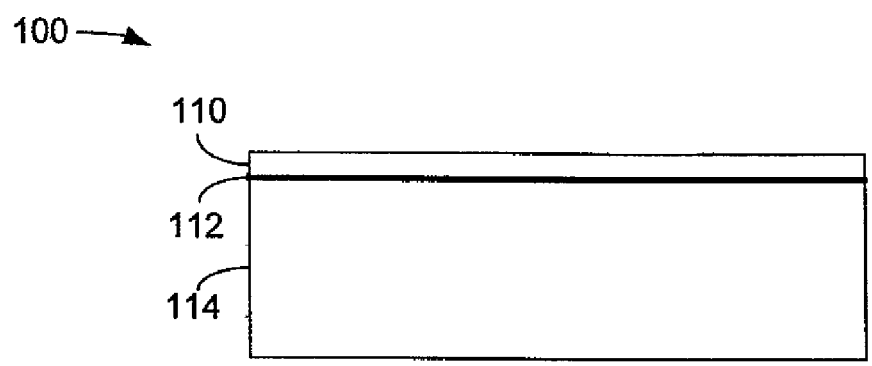

FIGS. 1A through 1C are schematic diagrams collectively illustrating a gallium nitride device substrate. The layers to be described below can be epitaxially grown using metal organic chemical vapor deposition (MOCVD) or other epitaxial growth methodologies. In FIG. 1A, a sacrificial substrate 102 is illustratively sapphire or silicon carbide. A buffer layer 104 of gallium nitride is formed over the sacrificial substrate 102. The buffer layer 104 is typically formed at a relatively low growth temperature in the range of 500-800 degrees C., and is typically referred to as a low temperature buffer layer. In one embodiment, the buffer layer 104 is formed of aluminum nitride and is typically grown approximately 5-50 nanometers (nm) thick. Alternatively, the buffer layer 104 may be formed of aluminum gallium nitride (AlGaN) and may also function as an etch stop layer. If the buffer layer 104 includes aluminum, an exemplary composition of the buffer layer 104 is $Al_xGa_{1-x}N$, where $0 \leq x \leq 1$ and is preferably $Al_xGa_{1-x}N$, where x=1 (AlN).

A gallium nitride intermediate layer 106 is grown over the buffer layer 104. The intermediate layer 106 is formed to a thickness of approximately 1-100 micrometers (μm) and can be doped n-type or p-type. In one embodiment in accordance with the invention, the intermediate layer 106 is doped n-type to facilitate later removal using photo-electric etching. The intermediate layer 106 may be formed using various techniques such as conventional MOCVD growth, hydride vapor phase epitaxial growth (HVPE), or can be formed using a technique such as epitaxial lateral overgrowth to form a relatively thick and dislocation free material layer. When formed using epitaxial lateral overgrowth, dielectric material is selectively patterned over the surface of the intermediate layer 106. Growth of the gallium nitride is then continued in which subsequent gallium nitride material grows vertically from the exposed surface of the layer 106, and then grows laterally over the surface of the dielectric mask, forming dislocation free regions over the dielectric mask. This process may be repeated until the desired thickness of the intermediate layer 106 is achieved.

In an embodiment in accordance with the invention, an additional etch stop layer 108 of AlGaN is formed over the intermediate layer 106. The etch stop layer has a composition of $Al_xG_{1-x}N$, where $0 \leq x \leq 1$. As will be described more fully below, in an embodiment in accordance with the invention, the etch stop layer 108 aids in the removal of the substrate 102, the buffer layer 104 and the intermediate layer 106 from one or more subsequently grown layers. A layer 110 of gallium nitride having an additional lattice parameter altering element is formed on the etch stop layer 108, if included. In one embodiment, the layer 110 comprises indium gallium nitride and has a composition of $In_{0.1}Ga_{0.9}N$. However, the composition may include $In_xGa_{1-x}N$, where $0 \leq x \leq 1$. A layer 110 of indium gallium nitride having approximately 10% indium can be grown on gallium nitride to a thickness of up to approximately 20 nm without the formation of dislocations, but in this embodiment, is preferably grown to a thickness of about 10 nm. By adding indium to the gallium nitride, the layer 110 has a lattice parameter that is larger than the lattice parameter of the intermediate layer 106. The in-plane "a-axis" lattice constant of GaN is ~3.19 angstroms (Å), the a-axis lattice constant of InN is ~3.50 Å, and the fully-relaxed a-axis lattice constant of $In_{0.1}Ga_{0.9}N$ is ~3.196 Å. Because of the lattice mismatch between the indium gallium nitride in the layer 110 and the gallium nitride in the intermediate layer 106, the indium gallium nitride layer 110 grows in a compressively strained condition so that its lattice parameter conforms to the lattice parameter of the intermediate layer 106.

In another embodiment in accordance with the invention, the layer 110 includes aluminum and has a composition of $Al_{0.1}Ga_{0.9}N$. However, the composition may include $Al_xGa_{1-x}N$, where $0 \leq x \leq 1$. A layer 110 of aluminum gallium nitride having approximately 10% aluminum can be grown on gallium nitride to a thickness of up to approximately 200 nm without the formation of dislocations, but in this embodiment, is preferably grown to a thickness of about 100 nm. By adding aluminum to the gallium nitride, the layer 110 has a lattice parameter that is smaller than the lattice parameter of the intermediate layer 106. Because of the lattice mismatch between the aluminum gallium nitride in the layer 110 and the gallium nitride in the intermediate layer 106, the aluminum gallium nitride layer 110 grows in a tensile strained condition so that its lattice parameter conforms to the lattice parameter of the intermediate layer 106.

In FIG. 1B, a bonding material 112 is applied over the layer 110. The bonding material 112 can be, for example, a metal alloy containing palladium, tungsten, titanium, or a combination of these. A substitute substrate 114 (also referred to as a new host substrate), is attached to the layer 110 using the bonding material 112. For example, the substitute substrate 114 can be bonded to the layer 110 using the bonding material 112 and a combination of heat and compression. The bonding material 112 should preferably provide a durable, resilient and pliable connection between the layer 110 and the substitute substrate 114, and also be capable of withstanding temperatures in excess of 1000 degrees C. In an embodiment, the substitute substrate 114 is capable of withstanding temperatures up to 1000 degrees C., or higher, and preferably has a thermal coefficient of expansion (TCE) close to the TCE of the layer 110 to which it is attached. For example, if the layer 110 is indium gallium nitride, then the substitute substrate 114 preferably has a TCE similar to the TCE of indium gallium nitride. Examples of suitable substitute substrate materials include silicon, gallium nitride, and aluminum nitride.

In FIG. 1C, the sacrificial substrate 102, buffer layer 104, intermediate layer 106 and, if present, etch stop layer 108 are removed, leaving the layer 110 attached to the substitute substrate 114. After the removal of the intermediate layer 106, the lattice structure, and hence the lattice parameter, of the layer 110 relaxes (i.e., expands due to the indium content in the layer 110), thus alleviating strain in the layer 110. In this example, the layer 110 is a layer of indium gallium nitride having a lattice constant of ~3.196 Å after the removal of the intermediate layer 106.

The sacrificial substrate 102, buffer layer 104, intermediate layer 106 and, if present, the etch stop layer 108 can be removed by various techniques including etching, laser lift-off, or a combination of these. Using laser lift-off, a transparent substitute substrate is used. A high power ultra-violet laser is scanned through the transparent sacrificial substrate 102 to melt the material at the interface of the sacrificial substrate 102 and the intermediate layer 106 allowing the removal of the sacrificial substrate 102, buffer layer 104 and most of the intermediate layer 106. However, this process likely leaves a residual amount of gallium nitride on the surface of the layer 110. The remaining gallium nitride can be removed by, for example, photo-electric etching, or another etching process. Photo-electric etching is polarity dependent, so in this embodiment, the intermediate layer 106 can be doped n-type to facilitate the photo-electric etching The presence of the etch stop layer 108 facilitates the removal of the remaining gallium nitride from the intermediate layer. Reactive ion etching (REI), or another timed dry-etching technique, can be used to remove the aluminum gallium nitride of the etch stop layer 108, exposing the layer 110. The removal of the intermediate layer 106 allows the lattice parameter of the layer 110 to relax, thus providing an indium gallium nitride, or an aluminum gallium nitride substrate over which to grow additional material layers that will have a closer lattice match to the layer 110 that forms the surface of the substrate 100, than they would to gallium nitride.

Figure 2:
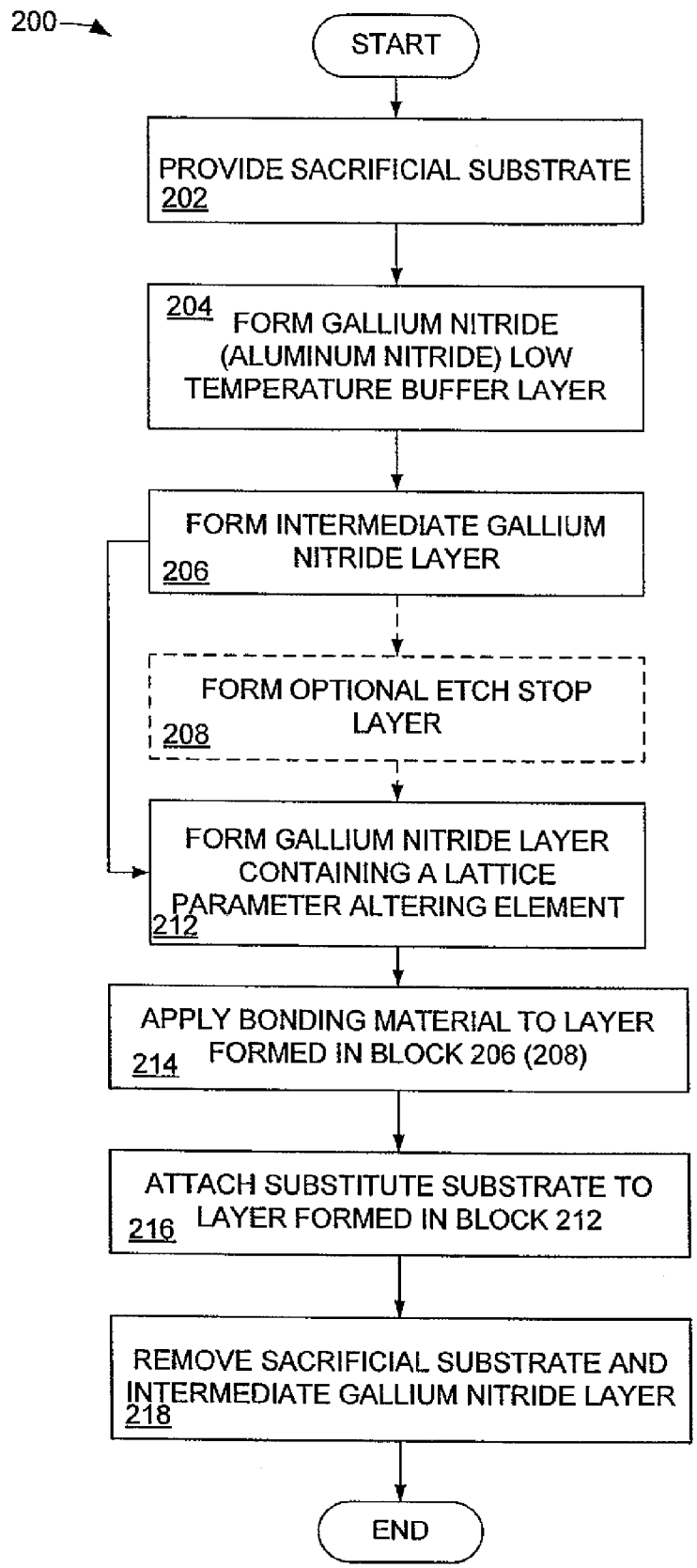
FIG. 2 is a flow chart illustrating an exemplary method for forming a substrate in accordance with an embodiment of the invention.

FIG. 2 is a flow chart 200 illustrating an exemplary method for forming a substrate in accordance with the invention. The blocks in the flow chart show one embodiment of the invention and need not be performed in the order shown. In block 202, a sacrificial substrate 102 is provided. In one embodiment, the sacrificial substrate 102 is sapphire, but it can also be silicon carbide, or another material. In block 204, a buffer layer 104 is formed over the sacrificial substrate 102. The buffer layer 104 is formed at a relatively low temperature and in one embodiment, is gallium nitride. Alternatively, the buffer layer 104 can be aluminum nitride and may function as an etch stop layer.

In block 206, an intermediate layer 106 of gallium nitride is formed over the buffer layer 104. In block 208, an optional etch stop layer 108 is formed over the intermediate layer 106.

The etch stop layer 108 can be, for example, aluminum gallium nitride and facilitates the removal of gallium nitride of intermediate layer 106 after the removal of the sacrificial substrate 102.

In block 212, a layer 110 of gallium nitride having a lattice parameter altering element is formed over the intermediate layer 106 and the etch stop layer 108, if present. The layer 110 can include indium or aluminum or a combination of these. In one embodiment, the layer 110 is indium gallium nitride, has a composition of $In_{0.1}Ga_{0.9}N$ and is approximately 10 nm thick. In block 214, a bonding material 112 is applied over the layer 110. The bonding material 112 is preferably a durable, resilient and pliable material that is capable of withstanding temperatures in excess of 1000 degrees C.

In block 216, a substitute substrate 114 is attached to the layer 110 using the bonding material 112 and a combination of heat and compression. In block 218, the sacrificial substrate 102, buffer layer 104, intermediate layer 106 and, if present, the etch stop layer 108 are removed. The removal of the intermediate layer 106 allows the lattice parameter of the layer 110 to relax, thus providing a gallium nitride device substrate over which to grow additional material layers that will have a closer lattice match to the layer 110, which forms the surface of the substrate 100, than they would to gallium nitride, or to indium gallium nitride formed over gallium nitride.

Figure 3A:
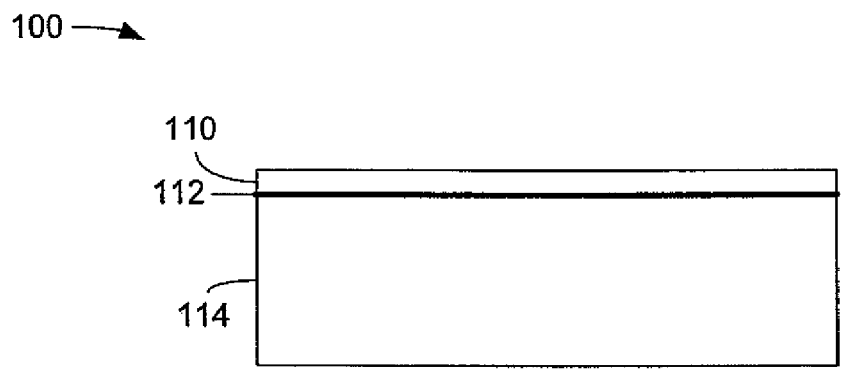
FIGS. 3A through 3C are schematic diagrams collectively illustrating an alternative embodiment of a gallium nitride device substrate containing a lattice parameter altering element.
Figure 3B:
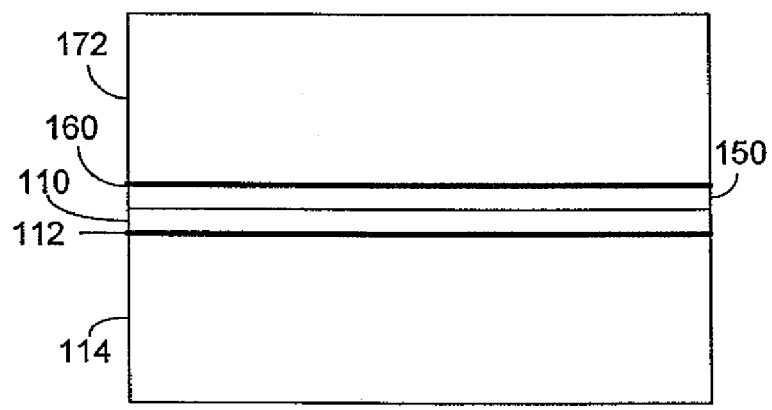
Figure 3C:
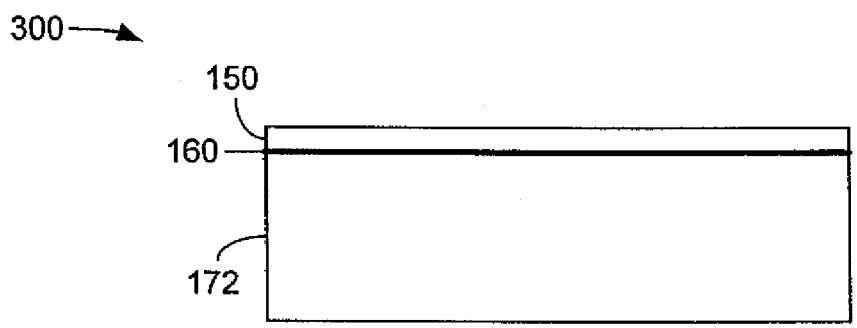

FIGS. 3A through 3C are schematic diagrams collectively illustrating an alternative embodiment of a gallium nitride device substrate containing a lattice parameter altering element. In FIG. 3A, a substrate 100 comprises a substitute substrate 114, a bonding material 112, and a layer 110 of gallium nitride having a lattice parameter altering element. In one embodiment, the layer 110 comprises indium gallium nitride having approximately 10% indium content.

In FIG. 3B, a layer 150 of gallium nitride having an additional lattice parameter altering element is formed on the layer 110. The layer 150 is similar to the layer 110 but has a different composition. Depending on the desired change in lattice parameter to be affected, the layer 150 of gallium nitride can include aluminum, indium or another element. In one embodiment, the layer 150 includes indium and has a composition of $In_xGa_{1-x}N$, where $0.1 \leq x \leq 0.2$. However, the composition of the layer 150 may be $In_xGa_{1-x}N$, where $0 \leq x \leq 1$.

A layer 150 of indium gallium nitride having up to approximately 20% indium can be grown on the indium gallium nitride layer 110 to a thickness of up to approximately 20 nm without the formation of dislocations, but in this embodiment, is preferably grown to a thickness of about 10 nm. As mentioned above, the indium gallium nitride layer 110 has an indium content of approximately 10%. By forming the layer 150 over the layer 110, an indium-rich layer 150 can be formed to a thickness thicker than if the layer 150 were formed on gallium nitride. The layer 110 forms a gallium nitride device substrate over which layers having progressively increased indium content may be formed to thicknesses that allow the formation of useful optoelectronic devices. The lattice mismatch between the layer 110 (having approximately 10% indium content) and the layer 150 (having approximately 20% indium content), while still present, is smaller than the lattice mismatch between a layer of indium gallium nitride having 20% indium content and gallium nitride having zero, or little, indium content.

In another embodiment in accordance with the invention, the layer 150 is formed over an aluminum gallium nitride layer 110 having an approximate 10% aluminum content, and has a composition of $Al_xGa_{1-x}N$, where $0.1 \leq x \leq 0.2$. However, the composition of the layer 150 may be $Al_xGa_{1-x}N$, where $0 \leq x \leq 1$. A layer 150 of aluminum gallium nitride having up to approximately 20% aluminum can be grown on a layer of aluminum gallium nitride having approximately 10% aluminum, to a thickness of up to approximately 500 nm without the formation of dislocations, but in this embodiment, is preferably formed to a thickness of about 250 nm. By forming the layer 150 over an aluminum-containing layer 110, an aluminum-rich layer 150 can be formed to a thickness thicker than if the layer 150 were formed on gallium nitride. The layer 110 forms an aluminum gallium nitride substrate over which layers having progressively increased aluminum content may be formed to a thickness that allows the formation of useful optoelectronic devices. The lattice mismatch between the layer 110 (having approximately 10% aluminum) and the layer 150 (having approximately 20% aluminum), while still present is smaller than the lattice mismatch between a layer of aluminum gallium nitride having 20% aluminum content and gallium nitride having zero, or little, aluminum content.

A bonding material 160, similar to the bonding material 112 is applied to the surface of the layer 150. An additional substitute substrate 172 is attached to the layer 150 using the bonding material 160 as described above. The additional substitute substrate 172 should exhibit the same qualities as the substitute substrate 114.

In FIG. 3C, the substitute substrate 114 is removed by, for example, etching as described above. If the substitute substrate is sapphire, then it can be removed using laser lift-off. If the substitute substrate is silicon, it can be removed using a wet etching process. In this manner, by repeating the growth process described, a substrate having high indium or aluminum content can be grown to provide an indium gallium nitride or an aluminum gallium nitride device substrate for the formation of optoelectronic devices in the gallium nitride material system that have fewer dislocation defects and high optical quality.

Figure 4:
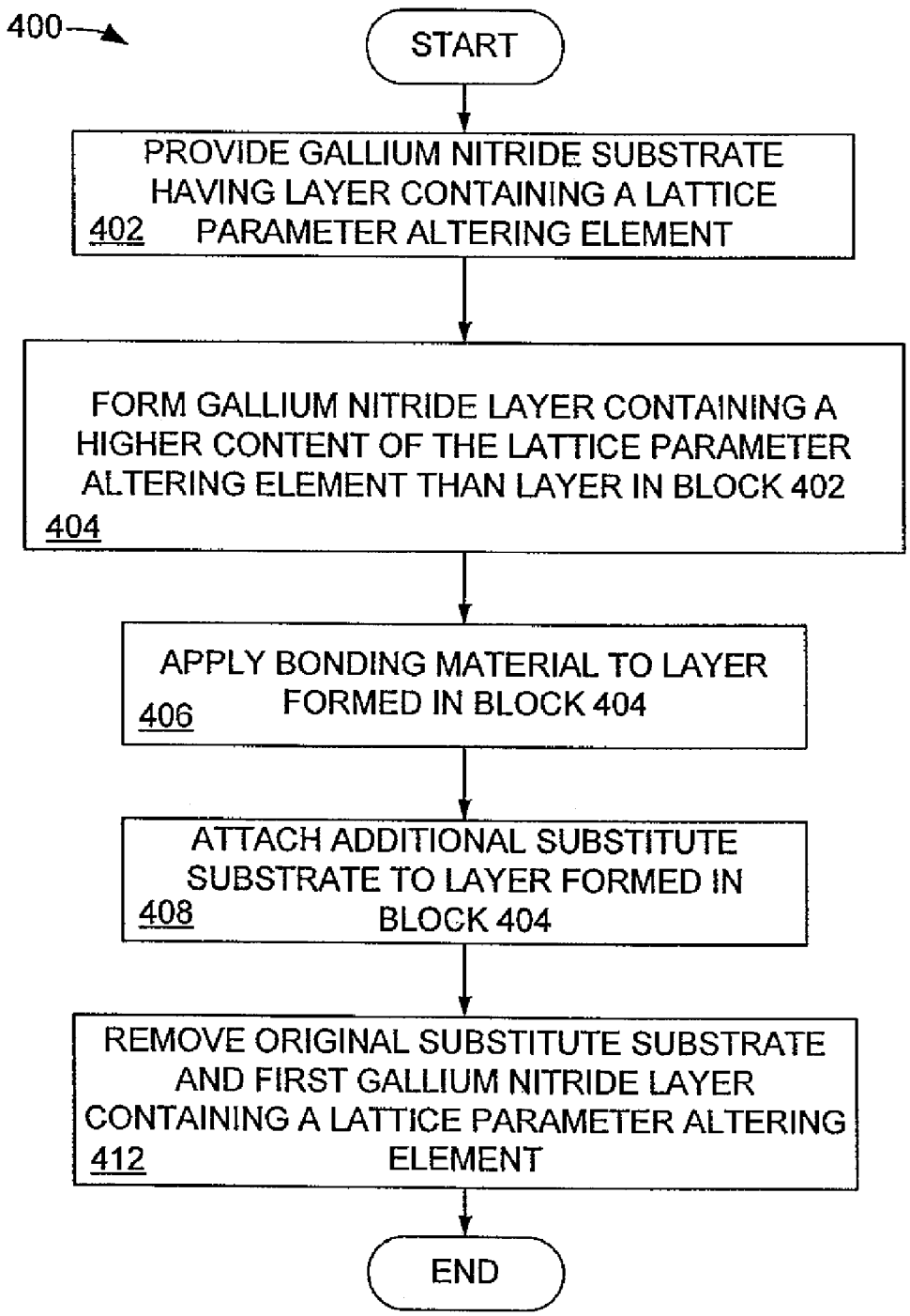
FIG. 4 is a flow chart illustrating an alternative method for forming a substrate in accordance with an embodiment of the invention.

FIG. 4 is a flow chart 400 illustrating an alternative method for forming a substrate in accordance with the invention. The blocks in the flow chart show an alternative embodiment of the invention and need not be performed in the order shown. In block 402, a gallium nitride device substrate 100 containing a lattice parameter altering element is provided. In one embodiment, a layer 110 of approximately 10% indium is provided. Alternatively a layer of approximately 10% aluminum may be provided. In block 404, a layer 150 of gallium nitride having a lattice parameter altering element is formed over the layer 110. The layer 150 can include indium, aluminum, gallium, or a combination of these. In this embodiment, the layer 150 includes indium and gallium, has a composition of approximately $In_{0.2}Ga_{0.8}N$ and is formed to a thickness of approximately 10 nm. In block 406, a bonding material 160 is applied over the layer 150. The bonding material 160 is preferably a durable, resilient and pliable material that is capable of withstanding temperatures in excess of 1000 degrees C.

In block 408, an additional substitute substrate 172 is attached to the layer 150 using the bonding material 160 and a combination of heat and compression. In block 412, the original substitute substrate 114 and the layer 110 are removed, leaving the additional substitute substrate 172 and the layer 150 of indium gallium nitride containing approximately 20% indium. The removal of the layer 110 allows the lattice parameter of the layer 150 to further relax, thus providing an indium gallium nitride device substrate having, in this example, an indium content of 20%, over which to grow additional material layers that will have a closer lattice match to the layer 150 that forms the surface of the substrate 300 than they would to gallium nitride, or the indium gallium nitride layer 110. This process can be repeated to create layers of indium gallium nitride having progressively increasing indium content. Alternatively, the layer 150 can be formed using aluminum to provide an aluminum gallium nitride layer having approximately 20% aluminum.

This disclosure describes embodiments in accordance with the invention. However, it is to be understood that the invention defined by the appended claims is not limited to the precise embodiments described.

What is claimed is:

1. A gallium nitride device substrate, comprising a first layer of gallium nitride containing a first concentration of indium located over a substitute substrate, where the first concentration of indium causes strain in the first layer of gallium nitride containing the first concentration of indium so that a lattice parameter of the first layer of gallium nitride containing the first concentration of indium conforms to a lattice parameter of an underlying layer of gallium nitride, and where absence of a sacrificial substrate and the underlying layer of gallium nitride results in a strain relieved first layer of gallium nitride containing the first concentration of indium that forms a surface of the gallium nitride device substrate in which the first layer of gallium nitride containing a first concentration of indium has a composition of $In_xGa_{1-x}N$, where $0.1 \leq x \leq 0.5$.

2. The substrate of claim 1, in which the first layer of gallium nitride containing a first concentration of indium has a composition of $In_{0.1}Ga_{0.9}N$.

3. A gallium nitride device substrate, comprising:

a first layer of gallium nitride containing a first concentration of indium located over a substitute substrate, where the first concentration of indium causes strain in the first layer of gallium nitride containing the first concentration of indium so that a lattice parameter of the first layer of gallium nitride containing the first concentration of indium conforms to a lattice parameter of an underlying layer of gallium nitride, and where absence of a sacrificial substrate and the underlying layer of gallium nitride results in a strain relieved first layer of gallium nitride containing the first concentration of indium that forms a surface of the gallium nitride device substrate; and a second layer of gallium nitride containing a second concentration of indium located over the first layer of gallium nitride containing the first concentration of indium, the second concentration of indium higher than the first concentration of indium.

4. The substrate of claim 3, in which the first layer of gallium nitride containing a first concentration of indium has a composition of $In_xGa_{1-x}N$, where $0.1 \leq x \leq 0.5$.

5. The substrate of claim 3, in which the second layer of gallium nitride containing a second concentration of indium has a composition of $In_xGa_{1-x}N$, where $0.1 \leq x \leq 0.5$.

6. The substrate of claim 3, in which the first layer of gallium nitride containing a first concentration of indium has a composition of $In_{0.1}Ga_{0.9}N$.

7. The substrate of claim 3, in which the second layer of gallium nitride containing the second concentration of indium has a composition of $In_{0.2}Ga_{0.8}N$.

* * * * *